United States Patent [19]

Welles, II

[11] Patent Number: 4,623,887

[45] Date of Patent: Nov. 18, 1986

[54] RECONFIGURABLE REMOTE CONTROL

[75] Inventor: Kenneth B. Welles, II, Schenectady, N.Y.

[73] Assignee: General Electric Company, Schenectady, N.Y.

[21] Appl. No.: 610,377

[22] Filed: May 15, 1984

[51] Int. Cl.⁴ .......................... G08C 19/00; H04N 5/44
[52] U.S. Cl. ........................... 340/825.57; 340/825.69;
340/825.72; 455/603; 358/194.1
[58] Field of Search ....................... 340/825.57, 825.69,
340/825.72, 825.34, 825.31; 358/194.1;
455/601, 603, 608

[56] References Cited

U.S. PATENT DOCUMENTS

| | | | |
|---|---|---|---|
| 4,200,862 | 4/1980 | Campbell et al. | 340/310 A |
| 4,274,082 | 6/1980 | Litz et al. | 340/167 R |
| 4,398,193 | 8/1983 | Kuniyoshi et al. | 358/194.1 |
| 4,535,333 | 8/1985 | Twardowski | 340/825.69 |

Primary Examiner—Ulysses Weldon
Assistant Examiner—Ralph E. Smith
Attorney, Agent, or Firm—Marvin Snyder; James C. Davis, Jr.

[57] ABSTRACT

A reconfigurable remote control transmitter is disclosed that has the ability to learn, store and repeat the remote control codes from any other infrared transmitter. The reconfigurable remote control transmitter includes an infrared receiver, a microprocessor, nonvolatile and scratch pad random access memories, and an infrared transmitter. The microprocessor application is divided into four main categories: learning, storing, retransmitting, and user interface. In the learning process, the reconfigurable remote control transmitter receives and decodes the transmissions from another remote control transmitter. The process is repeated at least twice for each key to make sure that it has been properly received and decoded. Once the data has been received and decoded, it is stored for later use. In order to do this, the received and decoded data is compressed so that it can fit into the nonvolatile memory. This process is repeated for each of the several remote control transmitters that are to be replaced by the reconfigurable remote control transmitter. When the learning and storing operations have been completed, the reconfigurable remote control transmitter is ready to use.

10 Claims, 13 Drawing Figures

MODULATION SCHEMES

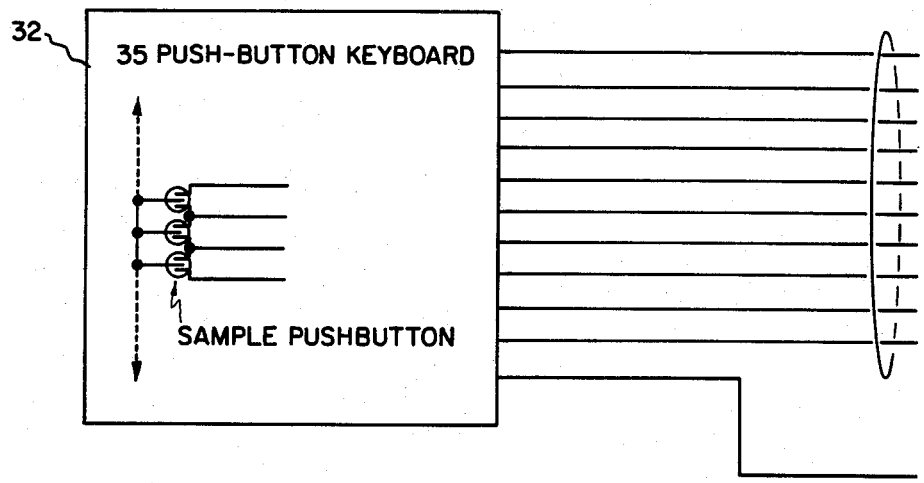
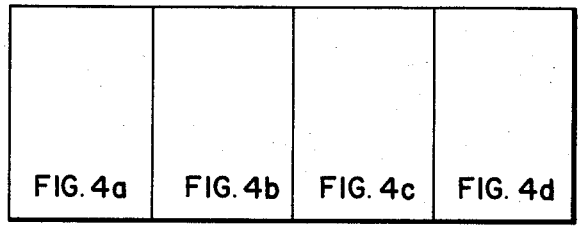
FIG.4e
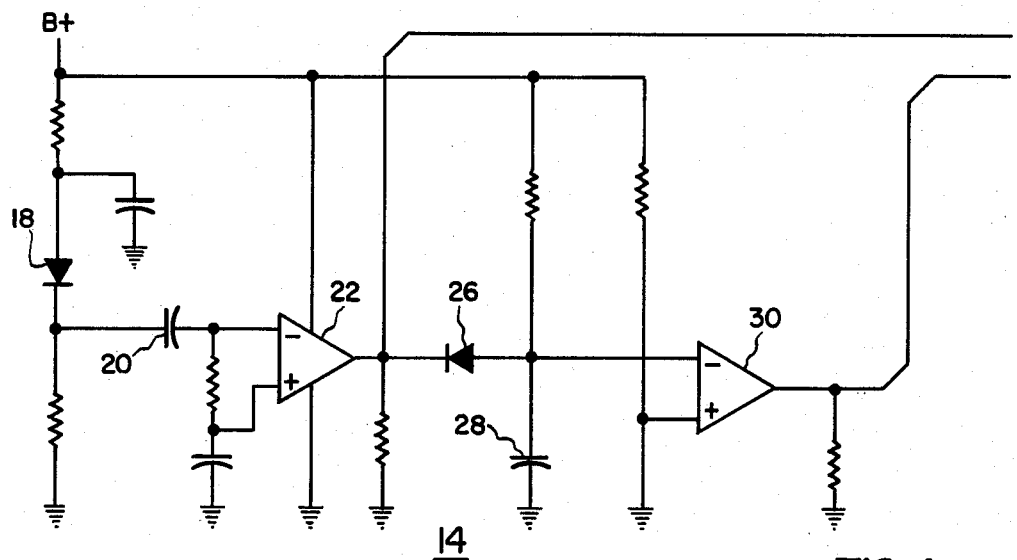
FIG.4a

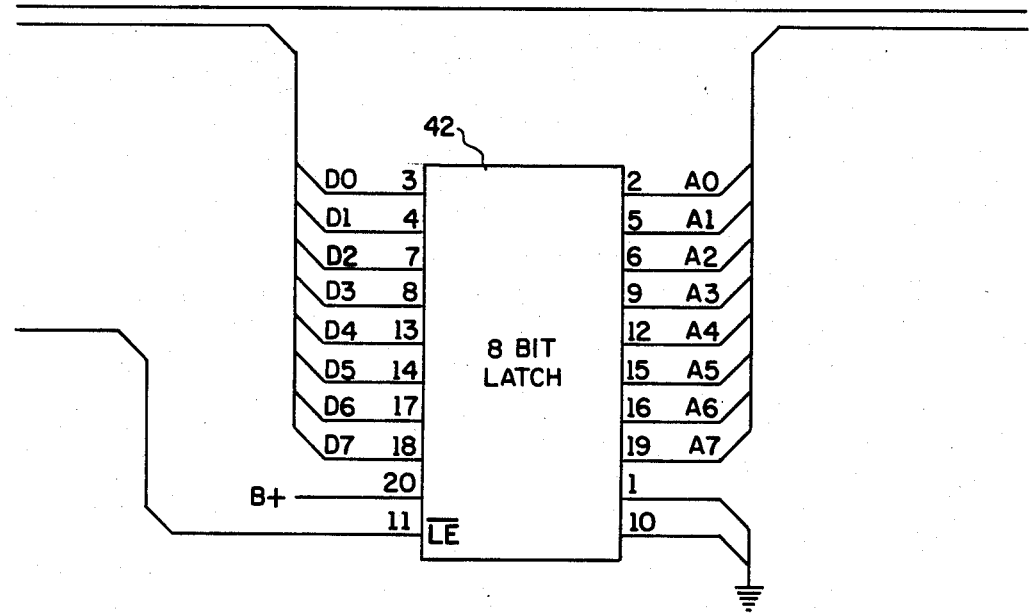
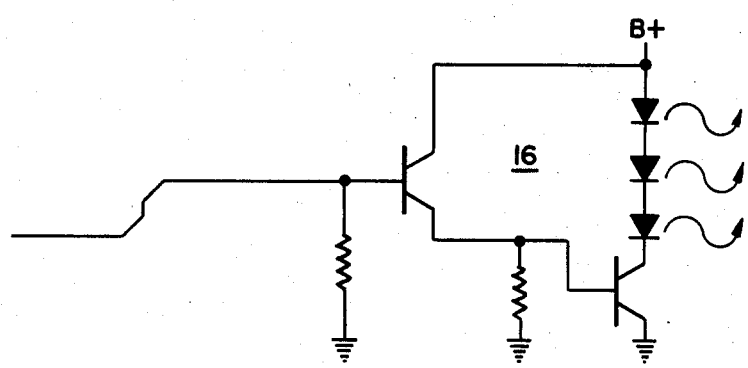
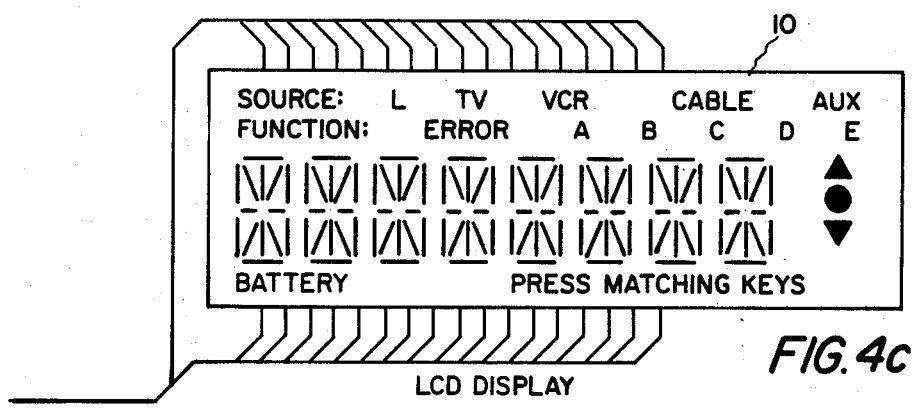
FIG. 4c

FIG. 5a

| BIT | 0 | 1 | 0 | 1 | 1 | 0 | |
|---|---|---|---|---|---|---|---|
| PULSES | 16 | 36 | 15 | 38 | 37 | 17 | |
| TIME | .40 | .92 | .39 | .95 | .93 | .42 | |
| TIME | | 1.42 | .94 | 1.36 | .90 | .96 | 200+ |
| BIN | A | B C D | A B | C D | C D | A | END |

FIG. 5b

| BIN | A | B | C | D |
|---|---|---|---|---|
| LOWER | 14 | 1.24 | 33 | .82 |
| MIDDLE | 16 | 1.42 | 37 | .94 |
| UPPER | 18 | 1.60 | 41 | 1.06 |
| TYPE | BURST | PAUSE | BURST | PAUSE |

FIG. 6

| | KEY SEQUENCE | | | | | | | | | | |
|---|---|---|---|---|---|---|---|---|---|---|---|
| 1 | 1st | A | B | C | D | A | B | C | D | A | |
| | 2nd | A | B | C | D | A | B | C | D | A | |
| | | | | | | | | | | | |
| | 1st | A | B | A | B | C | D | A | B | C | D | C |
| 2 | 2nd | A | B | A | B | C | D | E | ≡MOVED≡ | | |
| | 3rd | A | B | A | B | C | D | A | B | C | D | C |
| | | | | | | | | | | | |
| | 1st | A | B | C | D | C | D | A | B | F | ≡MOVED≡ |
| 3 | 2nd | A | B | C | D | C | D | A | B | A | B | C |
| | 3rd | A | B | C | D | C | D | A | B | A | B | C |
| | 4th | A | B | C | D | C | D | A | B | A | B | C |
| | | | | | | | | | | | |
| 4 | 1st | A | B | C | D | A | B | A | B | C | |
| | 2nd | A | B | C | D | A | B | A | B | C | |

FIG. 7

SEARCH FOR REPEAT SEQUENCE

BYTES: A B C D E F A B C D G H C D E F A B C D G H C D E F A B C D G H C D ...

REMOVE REPEATS

LOCATION 0 COMPARISON
- 1st: A B | X
- 2nd: A B C D | X
- 3rd: A B C D C D | X
- 4th: A B C D C D E F | X
- ...

LOCATION 2 COMPARISON
- 1st: A B | C | C D | X
- 2nd: A B | C D | X
- 3rd: A B | C D C D E F | X
- 4th: A B | C D C D E F A B | X
- ...

LOCATION 4 COMPARISON
- 1st: A B C D | C D | X
- 2nd: A B C D | C D E F | X
- 3rd: A B C D | C D E F A B C D | X
- 4th: A B C D | C D E F A B C D | X
- 5th: A B C D | C D E F A B C D G H | C D E F A B C D G H C D ...

|PREAMBLE| REPEATING PATTERN |

FIG. 8

REDUCED FORMAT

A B C D | C D E F A B C D G H |

RECONFIGURABLE REMOTE CONTROL

CROSS REFERENCE TO RELATED APPLICATION

The subject matter of this application is related to the subject matter of an application entitled "Programmable Functions for Reconfigurable Remote Control" filed by Raymond G. Ehlers, Ser. No. 610,549 filed concurrently herewith and assigned to a common assignee with this application. The subject matter of that application is incorporated herein by reference.

FIELD OF THE INVENTION

The present invention generally relates to remote control transmitters of the type used with various consumer products such as television receivers and the like and, more particularly, to a reconfigurable remote control transmitter which may be programmed to emulate any one of a plurality of individual transmitters.

BACKGROUND OF THE INVENTION

Many new consumer electronic products, particularly video products, are available with hand held infrared remote control transmitters. A consumer may have separate remote control transmitters for a television, a cable converter, video cassette recorder, and a video disc player, for example. In such a case, it is confusing to know which transmitter to pick up to control which prouct. Moreover, carrying around four different remote control transmitters spoils the convenience of the remote control feature. It is therefore desirable to provide a single remote control transmitter for controlling each of the several products.

A number of solutions have been proposed for this problem in the prior art. One example is disclosed in the patent to Litz et al, U.S. Pat. No. 4,274,082. In the Litz et al system, an amplifier, a tuner, a tape recorder, and a turntable are interconnected by a two-conductor cable. Each of these devices is controlled by a corresponding microprocessor, and a hand held transmitter is used to transmit coded signals that control the operation of the inivudal devices. The coded signals are received by a common receiver and first conversion circuit to provide voltage pulses on the two-wire cable. Additional conversion circuits are required for each microprocessor in order to convert the voltage pulses on the two-wire cable to pulses which can be used by the microprocessors.

Another example is disclosed in U.S. Pat. No. 4,200,862 to Campbell et al. The Campbell et al system includes a single receiver/transmitter unit which may be placed on a table, for example, and a hand held transmitter, but in this case, the receiver/transmitter unit injects digital pulses onto the house mains at times of zero crossing of the mains voltage. Various appliances are plugged into the house mains via slave units which are each responsive to an assigned digital address and a digital operation code to control its appliance.

Common to both the Litz et al and Campbell et al systems is the use of a central receiver, an interconnecting transmission line and the requirement of a separate controller device for each product or appliance. Clearly, this approach solves the basic problem of multiple transmitters for multiple products or appliances, but the solution is both complex and expensive from the point of view of the consumer. A simpler, less expensive solution to the problem is needed.

SUMMARY OF THE INVENTION

It is therefore an object of the present invention to provide a single remote control transmitter which can operate any product or appliance with a remote control feature without modification or interconnection of the individual products or appliances.

It is another object of the invention to provide a simple an inexpensive control for a plurality of remotely controlled consumer products even though those proucts may be produced by different manufactures and respond to different transmission protocols.

The objects of the invention are accomplished by providing a reconfigurable remote control transmitter that has the ability to learn, store and repeat the remote control codes from any other infrared transmitter. The reconfigurable remote control transmitter includes an infrared receiver, a microprocessor, nonvolatile and scratch pad random access memories, and an infrared transmitter. The microprocessor application is divided into four main categories: learning, storing, retransmitting, and user interface. In the learning process, the reconfigurable remote control transmitter receives and decodes the transmissions from another remote control transmitter for, say, a television receiver. The process is repeated at least twice for each key to make sure that it has been properly received and decoded. Once the data has been received and decoded, it must be stored for later use; however, in order to do this, the received and decoded data must be compressed so that it can fit into the nonvolatile memory. This process is repeated for each of the several remote control transmitters that are to be replaced by the reconfigurable remote control transmitter. When the learning and storing operations have been completed, the reconfigurable remote control transmitter is ready to use.

BRIEF DESCRIPTION OF THE DRAWINGS

The foregoing and other objects, advantages and aspects of the invention will be better understood from the following detailed description of the invention with reference to the drawings, in which:

FIGS. 4a–4d, aligned from left to right, constitute a block diagram designated FIG. 4 of the reconfigurable remote control transmitter according to a preferred embodiment of the invention;

FIGS. 5a and 5b are graphical and tabular representations of the data collection and initial data compression technique performed by the preferred embodiment shown in FIG. 4;

FIG. 6 is a tabular representation of the correlation process performed during the learning procedure;

FIG. 7 is a tabular representation of the process of removing repeats from the learned code in order to further compress the data for storing in the nonvolatile memory; and FIG. 8 is a tabular representation of the compressed learned code.

DETAILED DESCRIPTION OF THE PREFERRED EMBODIMENT

Figure 1:
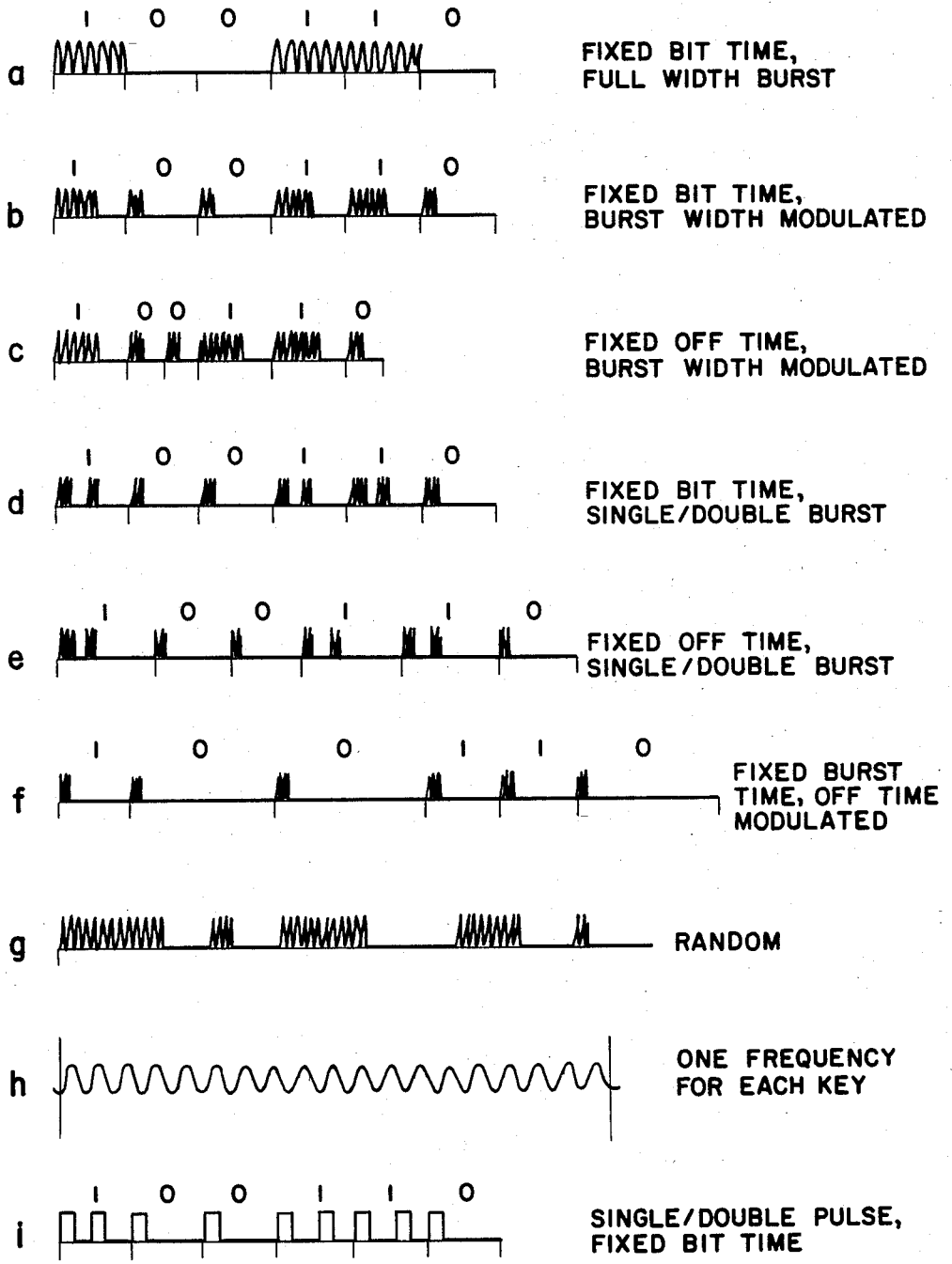
FIGS. 1a to 1i are graphical representations of several modulation schemes which are used in infrared remote control transmitters.

In order to understand the learning process, the available infrared codes to be learned must first be understood. This turns out to be a very wide range of different codes. FIG. 1 illustrates several modulation schemes. FIGS. 1a through 1g are different types of gated carrier frequency. Typical carrier frequencies for infrared remote transmitters are 20 KHz to 45 KHz, with the majority at 38 KHz and 40 KHz. The gating schemes illustrated include both fixed and variable bit periods, non-return to zero (NRZ), variable burst width, single/double burst modulation schemes, and a final catch-all category called random because there is no readily distinguishable pattern of ones and zeros. In addition to these schemes, there is also a transmitter which puts out a different continuous frequency (CW) for each key at approximately 300 Hz spacings as represented in FIG. 1h. Finally, several new types of transmitters do not use a carrier frequency at all but, instead, send a stream of pulses where the data is encoded in the spacing between infrared pulses as shown in FIG. 1i.

Figure 2:
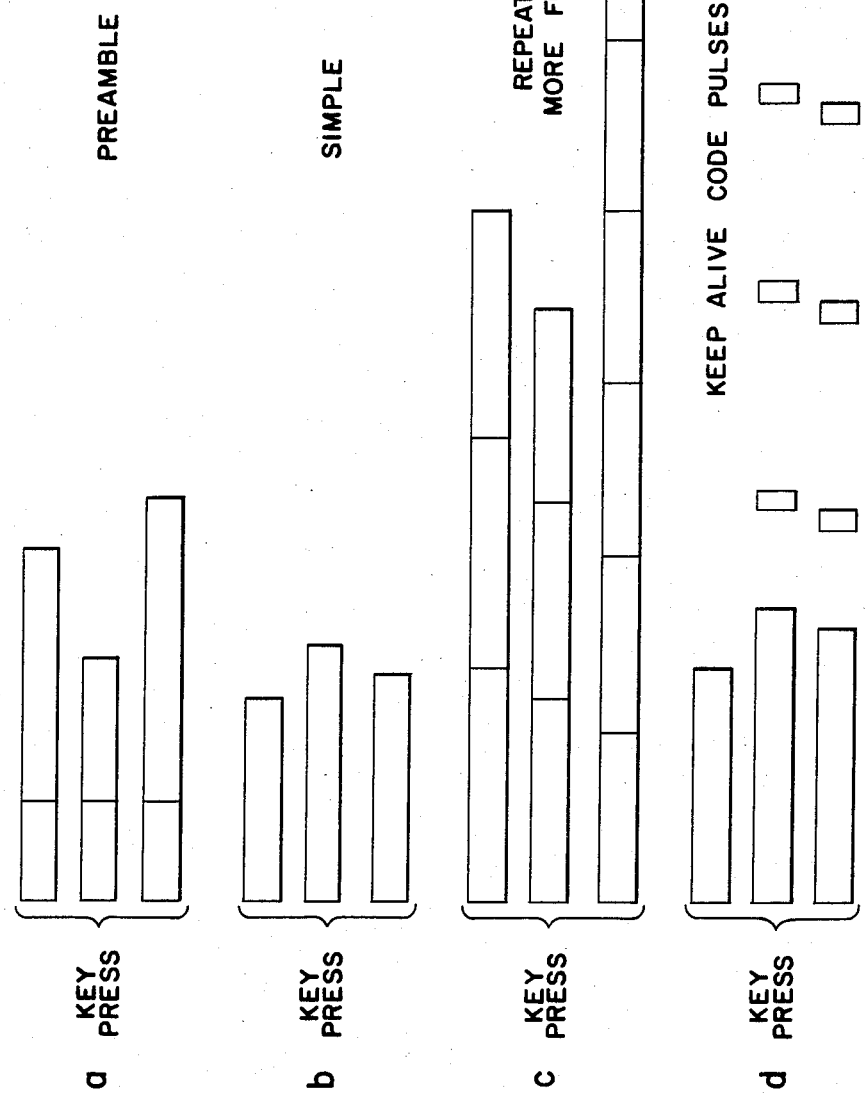
FIGS. 2a to 2d are graphical representations of several keyboard encoding schemes that may be used with the modulation schemes illustratted in FIGS. 1a to 1i.

FIG. 1 shows the data modulation schemes, but most transmitters also have a higher level of data organization, which may be called a keyboard encoding scheme. This causes data to be sent in different formats depending on the transmitter and the key pressed. FIG. 2 shows several of these keyboard encoding schemes. FIG. 2b shows data that is sent once for each key press. FIG. 2c shows data that is repeated three times and then stopped for each key press. These schemes are used to conserve power and extend battery life. FIG. 2c also shows data that continues to repeat as long as the key is pressed. This is often used for continuous functions such as volume control or channel scanning. FIG. 2d shows a modification of the continuous repeat scheme shown in FIG. 2c where the initial key data is sent, followed by a series of "keep-alive" pulses as long as the key is pressed. This scheme is also used to conserve power and extend battery life. In addition to schemes 2b through 2d, some remote control transmitters preceed all transmitted key data witth some form or preamble data stream to get the receiver's attention. This is shown in FIG. 2a, but it will be understood that such preamble data stream can be used with each of the keyboard encoding schemes shown in FIG. 2.

Figure 3:
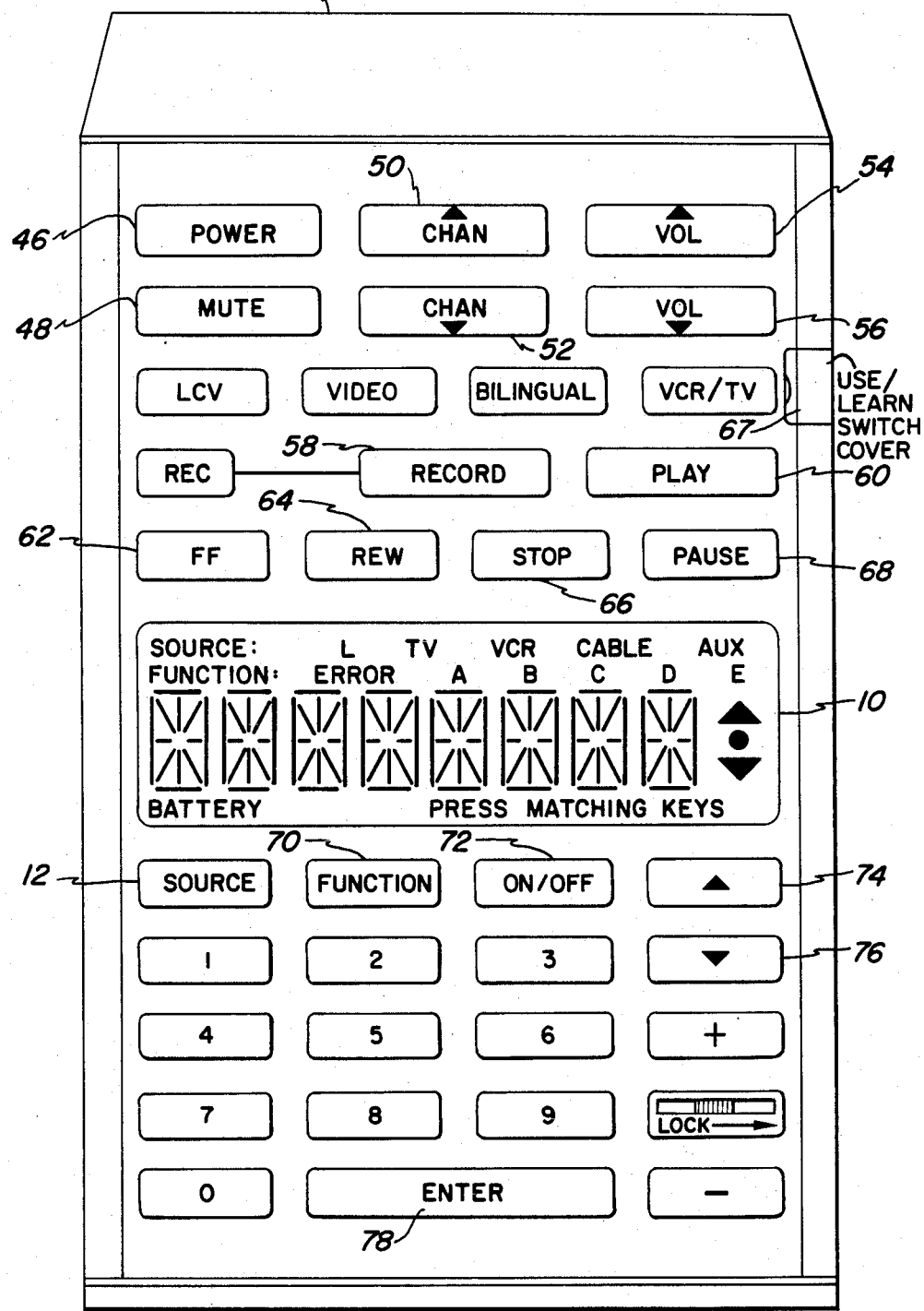
FIG. 3 is a plan view of the reconfigurable remote control transmitter according to a preferred embodiment of the present invention.

Reference is now made to FIG. 3 which shows in plan view the reconfigurable remote control transmitter according to a preferred embodiment of the invention. The first thing to be observed is that this unit is not much more complicated than a single transmitter for a single product. This is accomplished by the use of a combination of hard keys and soft keys and an liquid crystal display (LCD) about which more will be said latter. Suffice it to say for now that hard keys are those which have a predefined function and soft keys are those which have a programmable function. The reconfigurable remote control transmitter shown in FIG. 3 is capable of emulating up to four different transmitters which are indicated in the liquid crystal display 10 adjacent the legend "SOURCE" as TV, VCR, CABLE, and AUX, the latter being for "auxiliary" which may be any fourth device such as, for example, a video disc player. The user selects the desired source by pressing the source key 12 each time a change in the source is desired which causes the individual legends TV, VCR, CABLE, and AUX to be successively displayed in accordance with the succession of source key depressions. When the legend for the desired source is displayed, the user simply proceeds to operate the selected source. There is also provided a learning switch (not shown) which may be provided in a protected location on the side or bottom of the transmitter case since this switch is used only once (typically) for each transmitter which is to be emulated. This switch might be located, for example, behind a slidable or pivotal cover 67 in order to prevent younger members of the family from operating it. In the learning mode, the switch is moved to the learning position and the transmitter which is to be emulated is placed so that its transmitter infrared light emitting diode (LED) is adjacent the photoelectric receiver in the reconfigurable remote control unit. The photoelectric receiver 14 might, for example, be located at the end opposite to the infrared LED transmitter 16 in the reconfigurable remote control transmitter as shown in FIG. 3. The source is selected by pressing the source key 12 as described above, and when the legend for the desired source is displayed, the user presses the entire key 78. The user is then prompted in the liquid crystal display 10 to press a key on the reconfigurable remote control transmitter and a corresponding key on the transmitter to be emulated so that the transmitted code can be received and encoded. As will be explained in further detail, this prompt is repeated at least twice for each key in order to insure that the transmitted signal has been properly received and encoded.

Figure 4B:
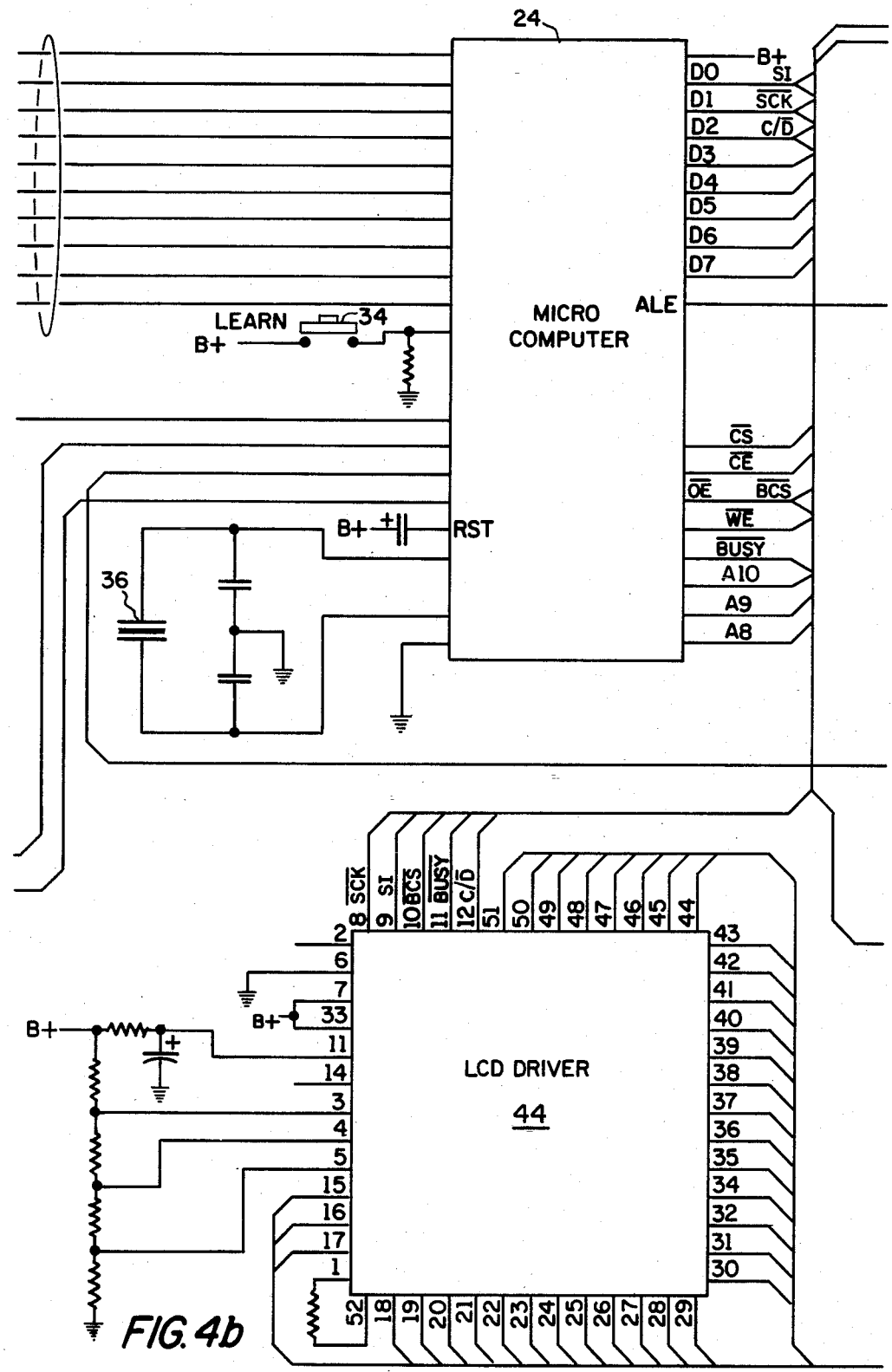
Figure 4D:
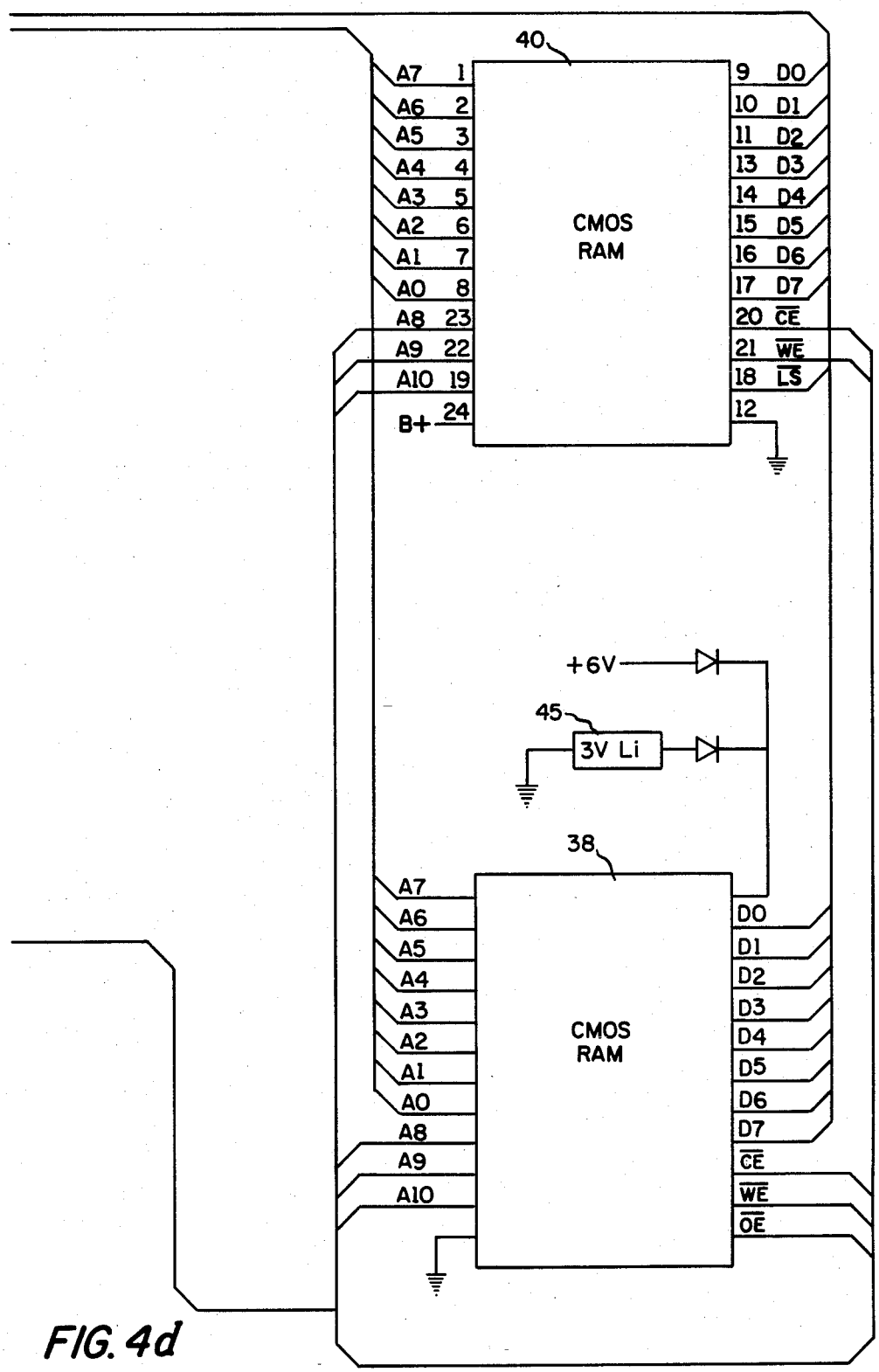

Turning now to FIG. 4, the receiver 14 for the reconfigurable remote control transmitter includes a photodiode 18 connected by a differentiating capacitor 20 to the variable input of threshold amplifier 22. The output of this amplifier 22 is a series of pulses having a frequency equal to the frequency of the transmitted signal. The output of amplifier 22 is connected to an input of the microprocessor 24 and also to a detector diode 26. The output of the detector diode 26 is integrated by capacitor 28 and supplied to the variable input of a second threshold amplifier 30. The output of this amplifier is the detected envelope of the transmitted signal and is supplied to another input of the microprocessor 24. Also supplied as inputs to the microprocessor 24 are the outputs of the push button keyboard 32 and the learn switch 34. The microprocessor 24 has its own internal clock which is controlled by a crystal 36. The microprocessor 24 provides addresses for the nonvolatile random access memory 38 and the scratch pad memory 40 to the address register 42 which comprises an 8-bit latch. The two memories are essentially the same except that the nonvolatile random access memory 38 is provided with a low voltage power supply 45, typically a lithium battery, in addition to being supplied from the main power supply in order to maintain the data stored in the memory even when the main battery supply is off or dead. The microprocessor 24 also provides the control signals to the LCD driver 46 which in turn controls the liquid crystal display 10. In addition, the microprocessor provides the drive signals for the infrared transmitter 16. In order to minimize battery drain, the several integrated circuits shown in FIG. 4 are made with CMOS (complementary metal oxide semiconductor) technology. For example, the microprocessor may be an Intel 87C51 or a Mitsubishi 50741 microprocessor, and the memories may be Intel 2816 or Hitachi HM6116 random access memories.

The reconfigurable remote control in the learning process, must be able to receive, learn and repeat all of the schemes described with reference to FIGS. 1 and 2. In addition, in the learning process the reconfigurable remote control must read each code at least twice to make sure that it has been properly received and decoded. Small variations in the incoming code must be tolerated while large variations (errors) must be recognized and rejected. The process, according to a procedure entitled LEARN ONE KEY in the program for microcomputer 24, is illustrated with reference to FIGS. 5 and 6. Referring to FIG. 5a first, the modulation scheme represented by FIG. 1b is taken as exemplary. This modulation scheme uses a fixed bit time but the burst width is modulated. In other words, the time for a binary "1" is the same as the time for a binary "0" but, in the case illustrated, the number of pulses transmitted for a "1" is more than for a "0". The time period for a binary bit is nominally 1.85 milliseconds, the number of pulses for a binary "1" is nominally 37, and the number of pulses for a binary "0" is nominally 16. When the learn switch 34, shown in FIG. 4 is switched to the "learn" position, the liquid crystal display 10 flashes the letter "L" to constantly remind the user that the reconfigurable remote control transmitter is in the learn mode. The user is then prompted to press a key on the reconfigurable remote control transmitter and a corresponding key on the transmitter to be emulated in order to transmit a signal to be received and encoded. The first step in the receiving and encoding process is to count the number of pulses in each burst and the time period of each pause between pulses. This pulse count and pause duration data completely defines the incoming signal. From this data the frequency of the transmitted signal is computed by dividing the largest number of pulses in a single burst by its corresponding time duration. For example, in FIG. 5a the largest number of pulses is 38 and its time period is 0.95 milliseconds, resulting in a 40 kilohertz transmitting frequency. The reason for using the largest number of pulses and its time period is to obtain the most accurate determination of the frequency of the transmitted signal. This initial raw data consists of 100 states, each state being defined as two 16-bit numbers (between 1 and 65,535). The first 16-bit number represents the number of infrared pulses in the pulse train. The second 16-bit number represents the time interval that the infrared pulse train was off. An additional 16-bit number represents the frequency of the infrared pulse train (typically from 30 KHz to 100 KHz). This data requires about 3200 bits of data per key pressed.

The first compression of this data is made by categorizing the pulse bursts and pauses into "bins", each bin being two bytes with the most significant bit indicating whether the bin is a burst or a pause. As shown in FIG. 5a, four bins, identified as CATEGORIES in the program for microcomputer 24 of FIG. 4, are established for the illustrated example according to a procedure of the program procedure entitled CONVERT IR DATA TO CATEGORIES. These are labeled A, B, C, and D with A and C being designated as bins for bursts and B and D being designated as bins for pauses. It will of course be understood that more or fewer bins may be required depending on the modulation scheme which is being learned. In order to categorize the pulse bursts and pauses into the several bins, a tolerance is established so that all the bursts and pauses within a nominal range are appropriately categorized into one or another of the bins. This is indicated in FIG. 5b which shows lower, middle and upper values of the number of pulses in a burst and the duration of a pause. Those bursts or pauses not falling into one of these bins would be assigned to another bin established for that burst or pause. By creating these bins, the initial raw data or about 3200 bits is stored to 1600 bits per key and 16 bits per bin in the scratch pad memory 40 in FIG. 4. The user is then prompted in the liquid crystal display 10 to press the encoded key a second time and the process is repeated. Then correlation is performed on the encoded data for that key as illustrated by FIG. 6. Suppose that for key one, the two encoded data are the same as shown at the top of the figure. In this case, the key code sequence has been properly learned and can be further compressed for storage in the nonvolatile memory 38. On the other hand, assume that in the process of pressing key two for the second time, the user inadvertently moves the transmitter to be emulated and the reconfigurable remote control transmitter with respect to one other so that the encoding for the second key press is an error. In this case, the user will be prompted on the liquid crystal display 10 to press the key a third time. If the third encoding matches the first as illustrated in the figure, then the key code sequence is considered to be properly learned and can be further compressed for storage in the nonvolatile memory. A third possiblity is illustrated in FIG. 6 and this is the case where the initial encoding is in error. Under these circumstances, no successive encoding would ever match the first. What the correlation algorithm does in this case is if the third encoding does not match the first, then the fourth is compared with the third and so on until a match of alternate encodings is obtained.

When each key has been properly learned, the initially encoded data for each key must be further compressed to such an extent that the data for all four remote transmitters will fit into a 2K byte memory. This data compression must maintain all of the vital information so that the infrared signal can be accurately reconstructed during transmission. The first step is illustrated in FIG. 7 and as set out in a procedure entitled REMOVE REPEATS in the program for microcomputer 24 of FIG. 4, involves the removal of repeats from the key encoding. It will be recalled that some of the keyboard encoding schemes shown in FIGS. 2c and 2d involved repeated transmission patterns. As illustrated in FIG. 7, the first two bytes (each representing a different bin) are compared with the second two bytes, and if there is no match, then the first four bytes are compared with the next four bytes. Again, if there is no match, the first six bytes are compared with the next six bytes and so on increasing in two byte intervals until a total of half of the stored bytes are being compared with the other half of the stored bytes. If no match is obtained, then the process is repeated from the start but omitting the first two bytes and then the first four bytes. In the case illustrated in the figure, a repeating pattern of ten bytes is found after an initial four byte preamble. The number and pattern of the repeats are then encoded in a reduced format, as shown in FIG. 8. This reduces data to between 6 and 60 states per key, 96 to 960 bits of data per key. Once this has been accomplished, the encoding for all keys is examined in order to determine if there is a common preamble. If there is, this preamble is separately encoded and stripped from the encoding of all keys according to a procedure entitled REMOVE PREAMBLES in the program for microcomputer 24 of FIG. 4. This reduces data to (typically) 96 to 480 bits per key. Then the number of bins is represented by a smaller number of bits than the eight bits comprising each byte. For the case illustrated in FIG. 5, for example, the number of bits required to represent the four bits is only two. Typically, the 8-bit bin pointer or number is reduced to a 5-bit or less bin pointer depending on the number of bins required to encode the original data. This typically reduces data to 48 to 240 bits per key. In this way, data is reduced to a manageable storage size, and all of the compression data is also retained to allow re-expansion of the data to its uncompressed format for retransmission during emulation. More specifically, the compressed data comprises the bin code, the position of the start of any repeating patterns, the length of the repeating pattern, the number of repeats, and the frequency of the transmission. If there is a preamble, this is stored separately to be generated for each key pressed. This compressed data is then stored in the nonvolatile memory 38 of FIG. 4.

This completes the learning and storing processes which are common to all the keys on the transmitter to be emulated. Certain keys are common to most remote transmitters, and these keys are included on the reconfigurable remote control transmitter as shown in FIG. 3. For example, the upper part of the transmitter includes a power key 46, a mute key 48, a channel up key 50, a channel down key 52, a volume up key 54, and a volume down key 56. In addition, specific keys may be provided for a video cassette recorder such as a record key 58, a play key 60, a fast forward key 62, a rewind key 64, a stop key 66, and a pause or stop motion key 68. At the lower part of the transmitter there is the usual numerical keypad and enter key. Other keys shown may be assigned other predetermined functions. However, because the remote transmitters from different manufacturers vary widely, providing all the keys from even four different remote control transmitters on one unit would unduly complicate the reconfigurable remote control transmitter of the present invention and make operation confusing to the user. To avoid this, programmable or "soft" keys are provided which are controlled by means of the function key 70. These keys include an on/off key 72, an up key 74 and a down key 76. The function performed by these keys depends on the function selected by the function key 70. More particularly, when the function key is pressed, a sequence of functions is displayed by the liquid crystal display depending upon the source that has been selected. The desired function is selected by sequencing the function key until that function is displayed. Examples of specific functions which may be performed by the several sources are listed in the following tables.

| LCD - TV FUNCTIONS | LCD - VCR FUNCTIONS |
|---|---|
| Clear Scr. | Slow |
| Sound Cont. | Slow |
| VIR | Search |
| Chan Block | Search |
| Off Timer | Reverse Play |
| Sound + | Fast Play |
| Cable | Frame Advan. |
| Audio Mode | A |
| Video Mode | B |
| Pict. Cont. | C |
| Pict. Cont. | |
| Brightness | LCD - CABLE FUNCTIONS |
| Brightness | Tuning |
| Color | Tuning |
| Tint | A |
| Tint | B |
| Treble | C |
| Treble | |
| Bass | LCD - AUX FUNCTIONS |
| Bass | TBD |
| Balance | A |
| Balance | B |
| Sharpness | C |
| Sharpness | |
| Homenet | |
| A | |
| B | |
| C | |

In FIG. 3, the function "Sharpness" has been selected for the source TV and the up and down arrows indicate that the up and down keys are to be used to control this function. It will be observed that each of the function tables include the functions "A", "B" and "C". These are for user defined functions for those situations that a transmitter to be emulated includes a function that is not previously stored in the reconfigurable remote control transmitter. In such a case, the user selects one of these functions and provides it with a label. This label is generated by either the + key or the − key to cycle through the alphabet. Once the correct letter is displayed, the user presses the enter key 72 to enter it and the display indexes over one character position where the process is repeated and so on until the complete label is generated. Thus, the liquid crystal display 10 and the keys of the reconfigurable remote control transmitter of the invention have been designed to provide a user friendly interface which is simple and easy to use no matter what combination of remote transmitters it is configured to emulate.

After the transmitter has been configured as desired by the user, it is ready to use. This requires that the transmitter recall, expand and transmit the required code. This is accomplished in accordance with procedures designated TRANSMIT ONE KEY, EXPAND ONE KEY and TRANSMIT EXPANDED CODE, respectively, in the program for microcomputer 24 of FIG. 4, by first determining which source has been chosen so that the correct block of data in the nonvolatile memory 38 is addressed. Then when a key is pressed, the entire block of data for that source is transferred to the scratch pad memory 40. If a preamble code exists, it is copied into a 200 byte array in memory 40. Next, the key code is copied into the 200 byte array after the preamble code. At the same time, the bit compressed codes for the preamble and the key code are expanded into byte codes. Then the start, length and repeat number values are added to the code for this key. All that remains is to generate the required carrier frequency. This is accomplished by software rather than provide individual carrier generators. In other words, the microprocessor uses its own clock and a divider process in order to generate the required frequency. Transmission of the expanded code is done by setting a pointer at the start of the 200 byte array and taking the 16-bit pulse count from the category indicated by the byte at the pointer. These pulses are transmitted at the carrier frequency for the pressed key. The 16-bit pause count from the category indicated by the byte at pointer +1 is then taken to determine the required length of time for the pause, and then the next pointer is taken and so on until the entire expanded code is transmitted.

Thus, there has been provided a reconfigurable remote control transmitter capable of emulating several remote control transmitters which is simple to use and requires no interconnection or modification of the products controlled. While a specific preferred embodiment has been described, those skilled in the art will recognize that the invention can be modified within the scope of the appended claims to provide for the control of more or less than four products or appliances which may or may not include video products. In addition, the specific data encoding and compression techniques may be modified to accommodate the data to the storage space available in the nonvolatile memory.

The program for the microprocessor written in a program design language (PDL) is set forth below. This program includes the detailed assembly instructions for generating the transmission frequencies. For a description of the program design language, the reader is referred to Van Leer, "Top Down Development Using a Program Design Language (PDL)", *IBM Systems Journal*, vol. 15, no. 3, pp. 155-170 (1976).

```
             RECONFIGURABLE REMOTE CONTROL
               PROGRAM DESCRIPTOR LANGUAGE

LEARNING, COMPRESSING, AND STORING THE CODE
         --------------------------------------------- procedure LEARN_ONE_REMOTE
   NUMBER_OF_CATEGORIES = 0
   do until EXIT_LEARN_MODE = true
      do LEARN_ONE_KEY
   end until
   do REMOVE_PREAMBLES
   do BIT_COMPRESS_REMOTE_DATA
   do STORE_REMOTE_DATA
end LEARN_ONE_REMOTE procedure LEARN_ONE_KEY
   ABORT_LEARN_MODE = false
   wait for .5 seconds of no incoming infrared
   request a key press on the remote to be learned
   do TAKE_IR_DATA
   OLD_DATA_SIZE = DATA_SIZE
   KEEP_CATEGORY_DATA = true
   if VALID_DATA = true then
      request a key release on the remote to be learned
      do CONVERT_IR_DATA_TO_CATEGORIES
      RETRIES = 16
      KEY_LEARNED = false
      do until RETRIES = 0 or ABORT_LEARN_MODE = true or KEY_LEARNED = true
         wait for .5 seconds of no incoming infrared
         request the same key press again on the remote to be learned
         do TAKE_IR_DATA
         request a key release on the remote to be learned
         if ABORT_LEARN_MODE = false then
            exchange OLD_DATA_SIZE and DATA_SIZE
            if OLD_DATA_SIZE = DATA_SIZE then
               do CONVERT_IR_DATA_TO_CATEGORIES
               if ABORT_LEARN_MODE = false then
                  if MISMATCH_COUNT < MISMATCH_TOLERANCE then
                     KEY_LEARNED = true
                  endif
               endif
            endif
            if KEY_LEARNED = false then RETRIES = RETRIES - 1
         endif
      end until
      set time out timer to 5 minutes
      request the corresponding key on the RRC to be pressed
      wait until time out or a key pressed on the RRC
      do REMOVE_REPEATS
      do STORE_ONE_KEY
   endif
end LEARN_ONE_KEY
```

```
procedure TAKE_IR_DATA
  set DATA_POINTER to beginning of a 400_BYTE_ARRAY
  set time out timer to 5 minutes
  CW = false
  FINITE = false
  ARRAY_FULL = false
  SINGLE_PULSE = false
  MAX_PULSES = 0
  NO_DATA_IN_5_MINUTES = false
  EXIT_LEARN_MODE = false
  wait until IR_ENVELOPE = true or LEARN_MODE = false or time out occurs
  If time out occurred then
    NO_DATA_IN_5_MINUTES = true
  else If LEARN_MODE = false then
    EXIT_LEARN_MODE = true
    VALID_DATA = false
  else
    do until CW = true or FINITE = true or ARRAY_FULL = true
      set time out timer to .5 seconds
      wait until time out occurs or IR_ENVELOPE = false
      If time out occurred then
        CW = true
        MAX_PULSES = pulse count
        MAX_TIME = time count
      else
        store pulse_count in 2 bytes at DATA_POINTER, DATA_POINTER+1
        DATA_POINTER = DATA_POINTER+2
        If pulse count > MAX_PULSES then
          MAX_PULSES = pulse count
          MAX_TIME = time count
        endIf
        set time out timer to .5 seconds
        wait until time out occurs or IR_ENVELOPE = true
        If time out occurred then
          FINITE = true
        else
          store time count in 2 bytes at DATA_POINTER, DATA_POINTER + 1
          DATA_POINTER = DATA_POINTER + 2
          If DATA_POINTER exceeds the 400_BYTE_ARRAY then ARRAY_FULL = true
        endIf
      endIf
    end until
    If MAX_PULSES = 1 then SINGLE_PULSE = true
    DATA_SIZE = (DATA_POINTER - beginIng of 400_BYTE_ARRAY) / 2
    VALID_DATA = true
  endIf
end TAKE_IR_DATA procedure CONVERT_IR_DATA_TO_CATEGORIES
  MISMATCH_COUNT = 0
  BURST_0_PAUSE_1 = 0
  CATEGORY_POINTER = start of 200_BYTE_ARRAY
  for DATA_POINTER = (start of 400_BYTE_ARRAY)
     to (start of 400_BYTE_ARRAY - 2 + DATA_SIZE) step 2
    If NUMBER_OF_CATEGORIES = 0 then
      do CREATE_A_NEW_CATEGORY
      CATEGORY_VALUE = 1
    else
      for CATEGORY_NUMBER = 1 to NUMBER_OF_CATEGORIES
        If BURST_0_PAUSE_1 = CATEGORY_TYPE(CATEGORY_NUMBER) then
          PULSE_TIME_COUNT = data at DATA_POINTER, DATA_POINTER1 + 1
          If PULSE_TIME_COUNT => (7/8) * CATEGORY_COUNT(CATEGORY_NUMBER) and
             and PULSE_TIME_COUNT <= (9/8) * CATEGORY_COUNT(CATEGORY_NUMBER) then
            CATEGORY_VALUE = CATEGORY_NUMBER
            goto FOUND_CATEGORY label
          endIf
        endIf
      next CATEGORY_NUMBER
      do CREATE_A_NEW_CATEGORY
      CATEGORY_VALUE = NUMBER_OF_CATEGORIES
    endIf
    label FOUND_CATEGORY
    If CATEGORY_VALUE <> data at CATEGORY_POINTER then
```

```
      MISMATCH_COUNT = MISMATCH_COUNT + 1
    endif
    If KEEP_CATEGORY_DATA = true then
      data at CATEGORY_POINTER = CATEGORY_VALUE
    endif
    BURST_0_PAUSE_1 = 1 - BURST_0_PAUSE_1
  next DATA_POINTER
end CONVERT_IR_DATA_TO_CATEGORIES procedure CREATE_A_NEW_CATEGORY
  NUMBER_OF_CATEGORIES = NUMBER_OF_CATEGORIES + 1
  If NUMBER_OF_CATEGORIES > MAX_CATEGORY_NUMBER then ABORT_LEARN_MODE = true
  CATEGORY_COUNT(NUMBER_OF_CATEGORIES) = data at DATA_POINTER, DATA_POINTER+1
  CATEGORY_TYPE(NUMBER_OF_CATEGORIES) = BURST_0_PAUSE_1
end CREATE_A_NEW_CATEGORY procedure REMOVE_PREAMBLES
  PREAMBLE_LENGTH = 1
  PREAMBLE = true
  do until PREAMBLE = false
    KEY = 2
    do until KEY > NUMBER_OF_KEYS_LEARNED or PREAMBLE = false
      If KEY_CATEGORY_VALUE(1, PREAMBLE_LENGTH) <>
        KEY_CATEGORY_VALUE(KEY, PREAMBLE_LENGTH) then PREAMBLE = false
      KEY = KEY + 1
    end until
  end until
  PREAMBLE_LENGTH = PREAMBLE_LENGTH - 1
  If PREAMBLE_LENGTH > 0 then
    for I = 1 to PREAMBLE_LENGTH
      PREAMBLE_CODE(I) = KEY_CATEGORY_VALUE(1, I)
    next I
    for KEY = 1 to NUMBER_OF_KEYS_LEARNED
      KEY_DATA_SIZE(KEY) = KEY_DATA_SIZE(KEY) - PREAMBLE_LENGTH
      for I = 1 to KEY_DATA_SIZE(KEY)
        KEY_CATEGORY_VALUE(KEY, I) =
          KEY_CATEGORY_VALUE(KEY, I + PREAMBLE_LENGTH)
      next I
    next KEY
  endif
end REMOVE_PREAMBLES procedure REMOVE_REPEATS
  REPEAT_TIMES = 0
  for REPEAT_START = 0 to (DATA_SIZE - 4) step 2
    for REPEAT_LENGTH = 2 to (DATA_SIZE - REPEAT_START) / 2 step 2
      REPEAT=true
      for I = REPEAT_START to DATA_SIZE - REPEAT_LENGTH
        If 200_BYTE_ARRAY(I) <> 200_BYTE_ARRAY(I + REPEAT_LENGTH) then
          REPEAT = false
          goto NOT_A_REPEAT label
        endif
      next I
      REPEAT_TIMES = (DATA_SIZE - REPEAT_START) / REPEAT_LENGTH
      If DATA_SIZE = 200 then REPEAT_TIMES = 255
      DATA_SIZE = REPEAT_START + REPEAT_LENGTH
      goto FOUND_A_REPEAT label
      label NOT_A_REPEAT
    next REPEAT_LENGTH
  next REPEAT_START
  label FOUND_A_REPEAT
end REMOVE_REPEATS
procedure BIT_COMPRESS_REMOTE_DATA
  CATEGORY_BITS = 5
  If NUMBER_OF_CATEGORIES <17 then CATEGORY_BITS = 4
  If NUMBER_OF_CATEGORIES < 9 then CATEGORY_BITS = 3
  If NUMBER_OF_CATEGORIES < 5 then CATEGORY_BITS = 2
  If NUMBER_OF_CATEGORIES < 3 then CATEGORY_BITS = 1
  for KEY = 1 to NUMBER_OF_KEYS_LEARNED
```

```
     BIT_COUNT = 0
     BYTE_COUNT = 0
     for I = 1 to KEY_DATA_SIZE(KEY)
       BIT_DATA = KEY_CATEGORY_VALUE(KEY, I)
       shift BIT_DATA left 8 minus CATEGORY_BITS times
       for J = 1 to CATEGORY_BITS
         shift BIT_DATA left one bit into carry
         shift the carry bit into the right end of COMPRESSED_DATA
         BIT_COUNT = BIT_COUNT + 1
         if BIT_COUNT = 8 then
           BYTE_COUNT = BYTE_COUNT + 1
           KEY_CATEGORY_VALUE(KEY, BYTE_COUNT) = COMPRESSED_DATA
           BIT_COUNT = 0
         endif
       next J
     next I
     if BIT_COUNT > 0 then
       shift COMPRESSED_DATA left 8 minus BIT_COUNT times
       BYTE_COUNT = BYTE_COUNT + 1
       KEY_CATEGORY_VALUE(KEY, BYTE_COUNT) = COMPRESSED_DATA
     endif
   COMPRESSED_COUNT(KEY) = BYTE_COUNT
   next KEY
end BIT_COMPRESS_REMOTE_DATA procedure STORE_ONE_KEY
   using the addresses which are stored starting at DATPTR, search thru
   the key data that has all ready been stored
   if data has all ready been stored for this key then
      erase the previously stored data from the area pointed to by the
      address in DATPTR
      move all data beyond the erased data in to fill up the area erased
      correct all of the addresses in DATPTR to reflect the data movement
      move all addresses in DATPTR to cover the address removed
   find the first free memory location beyond the last stored key data (KEY_N)
   place the address of this memory location beyond the last stored address
   in DATPTR
   place the following data in the memory starting at the address just stored:
      KEY_NUMBER the number of the RRC key which this code corresponds to
      KEY_FREQUENCY the calculated byte to be stored in DTYCYC
      KEY_FREQUENCY_RANGE the number to be used in LOFREQ, or an indication
         of whether to use LA1, LB1 or LC1 to generate frequency
      KEY_REPEAT_START the data in REPEAT_START
      KEY_REPEAT_LENGTH the data in REPEAT_LENGTH
      KEY_REPEAT_TIMES the data in REPEAT_TIMES
      KEY_CATEGORY_VALUE the set of (REPEAT_START+REPEAT_LENGTH) bytes in the
         200_BYTE_ARRAY
end STORE_ONE_KEY procedure STORE_REMOTE_DATA
   find the adress of the remote just learned at REMOTES
   delete the old data stored at that address
   load the new data as previously calculated, stored in the format
   shown below in DATA AS STORED IN NON-VOLATILE RAM AFTER LEARN OPERATIONS
end STORE_REMOTE_DATA RECALLING, EXPANDING AND TRANSMITTING THE CODE
         ------------------------------------------------ procedure TRANSMIT_ONE_KEY
   determine which mode (TV, VCR, CABLE, AUX) is chosen
   acquire address of remote data from REMOTES array in non-volatile memory
   if valid data for this remote exists in the non-volatile memory then
      copy data from non-volatile memory into volatile memory
   else
```

```
      if valid data for this remote exists in the CPU ROM then
         copy data from CPU ROM into volatile memory
      else
         no valid code exists for this remote
      endif
   endif
   if no valid code exists for the key pressed then
      if a default key exists then
         copy data for default key into volatile memory
      endif
   else
      flash a warning to the user that no such key exists
   endif
   if valid or default code has been copied to the volatile memory then
      do EXPAND_ONE_KEY
      do TRANSMIT_EXPANDED_CODE
   endif
end TRANSMIT_ONE_KEY procedure EXPAND_ONE_KEY
   copy the preamble code (if any) into the 200_BYTE_ARRAY
   copy the key code into the 200_BYTE_ARRAY after the preamble code, expanding
   the bit compressed code into byte codes
   add the preamble length to the KEY_REPEAT_START value for this key
end EXPAND_ONE_KEY procedure TRANSMIT_EXPANDED_CODE
   for pointer=start of 200_BYTE_ARRAY to
      start of 200_BYTE_ARRAY + KEY_REPEAT_START  step 2
      take 16 bit pulse count from category indicated by byte at pointer
      place 16 bit pulse count into PLSMSB, PLSLSB
      transmit these pulses at the carrier frequency for this key
      take 16 bit pause count from category indicated by byte at pointer+1
      pause for the proper length of time
   next pointer
   do until (key on RRC no longer pressed) or (KEY_REPEAT_TIMES = 0)
      for pointer = start of 200_BYTE_ARRAY + KEY_REPEAT_START to
      start of 200_BYTE_ARRAY + KEY_REPEAT_START + KEY_REPEAT_LENGTH step 2
         take 16 bit pulse count from category indicated by byte at pointer
         place 16 bit pulse count into PLSMSB, PLSLSB
         transmit these pulses at the carrier frequency for this key
         take 16 bit pause count from category indicated by byte at pointer+1
         pause for the proper length of time
      next pointer
      if KEY_REPEAT_TIMES <> 255 then KEY_REPEAT_TIMES = KEY_REPEAT_TIMES - 1
   end until
end TRANSMIT_EXPANDED_CODE CODE EXAMPLES FOR CARRIER FREQUENCY CODE GENERATION
         ----------------------------------------------------
;In all of the following examples, the number of pulses to be sent is stored
;as a 16 bit number 1-65279. The number of pulses to be sent plus 256 is
;stored in PLSMSB,PLSLSB. These bytes are in the zero page.
;Bytes DTYCYC and LOFREQ are in the zero page, and determine the carrier
;frequency. LED is an I/O bit that can be set and cleared in the zero page
;mode. After all pulses have been sent, all routines branch to label QUIT.
;Any frequency between 15KHz and 45KHz can be generated with a maximum
;absolute average error of less than 10Hz and a maximum cycle to cycle
;variation of 14%.

;LOOP FOR CARRIER FREQUENCIES FROM 41.667KHz TO 45.454KHz (15Hz resolution)
;frequency=1,000,000/(24-2*(DTYCYC/256)) Hz LA1     DEC     PLSMSB  ;count the most significant byte of the pulse counter
        BEQ     QUIT    ;exit the system if all pulses have been sent
LA2     SEB     LED     ;turn on the LED
        DEC     PLSLSB  ;count the least significant byte of the pulse counter
        CLB     LED     ;turn off the LED (duty cycle 10us on, 12us off)
        BEQ     LA1     ;loop to start after every 256 pulses
LA3     ADC     DTYCYC  ;add the dutycycle in to generate the frequency
```

```
             BCS      LA2         ;If the carry is set, go thru the high frequency loop
             SEB      LED         ;turn on the LED
             DEC      PLSLSB      ;count the least significant byte of the pulse counter
             CLB      LED         ;turn off the LED (duty cycle 10us on, 14us off)
             BEQ      LA1         ;loop to start after every 256 pulses
             BNE      LA3         ;if it gets here, it always branches ;LOOP FOR CARRIER FREQUENCIES FROM 38.462KHz TO 41.667KHz (13Hz resolution)
;frequency=1,000,000/(26-2*(DTYCYC/256)) Hz LB1          DEC      PLSMSB      ;count the most significant byte of the pulse counter
             BEQ      QUIT        ;exit the system if all pulses have been sent
LB2          SEB      LED         ;turn on the LED
             CLC                  ;make sure ADC that follows has no minor errors
             DEC      PLSLSB      ;count the least significant byte of the pulse counter
             CLB      LED         ;turn off the LED (duty cycle 12us on, 12us off)
             BEQ      LB1         ;loop to start after every 256 pulses
LB3          ADC      DTYCYC      ;add the dutycycle in to generate the frequency
             BCS      LB2         ;if the carry is set, go thru the high frequency loop
             SEB      LED         ;turn on the LED
             CLC
             DEC      PLSLSB      ;count the least significant byte of the pulse counter
             CLB      LED         ;turn off the LED (duty cycle 12us on, 14us off)
             BEQ      LB1         ;loop to start after every 256 pulses
             BNE      LB3         ;if it gets here, it always branches ;LOOP FOR CARRIER FREQUENCIES FROM 34.483KHz TO 38.462KHz (16Hz resolution)
;frequency=1,000,000/(29-3*(DTYCYC/256)) Hz LC1          DEC      PLSMSB      ;count the most significant byte of the pulse counter
             BEQ      QUIT        ;exit the system if all pulses have been sent
LC2          SEB      LED         ;turn on the LED
             CLC
             DEC      PLSLSB      ;count the least significant byte of the pulse counter
             CLB      LED         ;turn off the LED (duty cycle 12us on, 14us off)
             CLC
             BEQ      LC1         ;loop to start after every 256 pulses
LC3          ADC      DTYCYC      ;add the dutycycle in to generate the frequency
             BCS      LC2         ;if the carry is set, go thru the high frequency loop
             SEB      LED         ;turn on the LED
             LDX      PLSLSB      ;this is a 3 microsecond no-op
             DEC      PLSLSB      ;count the least significant byte of the pulse counter
             CLB      LED         ;turn off the LED (duty cycle 13us on, 16us off)
             CLC
             BEQ      LC1         ;loop to start after every 256 pulses
             BNE      LC3         ;if it gets here, it always branches ;LOOP FOR FREQUENCIES FROM 30.303KHz TO 34.483KHz (n=1, 17Hz resolution)
;LOOP FOR FREQUENCIES FROM 27.027KHz TO 30.303KHz (n=2, 13Hz resolution)
;LOOP FOR FREQUENCIES FROM 24.390KHz TO 24.390KHz (n=3, 11Hz resolution)
;LOOP FOR FREQUENCIES FROM 22.222KHz TO 24.390KHz (n=4, 9Hz resolution)
;LOOP FOR FREQUENCIES FROM 20.408KHz TO 22.222KHz (n=5, 8Hz resolution)
;LOOP FOR FREQUENCIES FROM 18.868KHz TO 20.408KHz (n=6, 7Hz resolution)
;LOOP FOR FREQUENCIES FROM 17.544KHz TO 18.868KHz (n=7, 6Hz resolution)
;LOOP FOR FREQUENCIES FROM 16.393KHz TO 17.544KHz (n=8, 5Hz resolution)
;LOOP FOR FREQUENCIES FROM 15.384KHz TO 16.393KHz (n=9, 4Hz resolution)
;LOOP FOR FREQUENCIES FROM 14.493KHz TO 15.384KHz (n=10, 4Hz resolution)
;frequency=1,000,000/(29+4n-4*(DTYCYC/256)) Hz LF1          DEC      PLSMSB      ;count the most significant byte of the pulse counter
             BEQ      QUIT        ;exit the system if all pulses have been sent
LF2          SEB      LED         ;turn on the LED
             LDX      LOFREQ      ;reset the low frequency counter
             CLB      LED         ;turn off the LED (duty cycle 8us on, (17+4n)us off)
LF4          DEX                  ;wait for a calculated delay
             BEQ      LF4         ;loop the number of times in the X register
             DEC      PLSLSB      ;count the least significant byte of the pulse counter
             BEQ      LF1         ;loop to start after every 256 pulses
LF3          ADC      DTYCYC      ;add the dutycycle in to generate the frequency
             BCS      LF2         ;if the carry is set, go thru the high frequency loop
             SEB      LED         ;turn on the LED
             LDX      LOFREQ      ;reset the low frequency counter
             CLB      LED         ;turn off the LED (duty cycle 8us on, (21+4n)us off)
```

```
LF5     DEX                 ;wait for a calculated delay
        BEQ     LF5         ;loop the number of times in the X register
        DEC     PLSLSB      ;count the least significant byte of the pulse counter
        BEQ     LF1         ;loop to start after every 256 pulses
        NOP
        BNE     LF3         ;if it gets here, it always branches
```

DATA BASE DESCRIPTION

200_BYTE_ARRAY This is a 200 byte array of data. Each byte contains one
    category (a value from 1 to 25). The first, third, fifth, etc.
    bytes contain categories of bursts of IR pulses. The second, fourth,
    sixth, etc. bytes contain categories of pauses between IR bursts.
    This array is filled by the procedure CONVERT_IR_DATA_TO_CATEGORIES.
    This array is used by REMOVE_REPEATS, and emptied by STORE_ONE_KEY.

400_BYTE_ARRAY This is 200 entry array with 2 bytes per entry. Each entry
    contains a number between 0 and 65535. The first, third, fifth, etc.
    entries contain actual numbers of pulses counted during IR bursts of
    data. The second, fourth, sixth, etc. entries contain a measure
    of the time between bursts of pulses. This array is filled by the
    procedure TAKE_IR_DATA. This array is emptied by the procedure
    CONVERT_IR_DATA_TO_CATEGORIES ABORT_LEARN_MODE A bit set false at the start of a learn procedure
    and set true on any condition causing the learn procedure to stop.

ARRAY_FULL A bit set true if the IR data learned continued for more
    than 100 IR bursts and pauses (indicating that the 400_BYTE_ARRAY
    is full). This bit is false if the bits CW or FINITE are set.

BIT_COUNT An 8 bit value which counts from 0 to 7 and then back to 0.
    This is used by the procedure BIT_COMPRESS_REMOTE_DATA to compress
    the category representations into a smaller space.

BIT_DATA An 8 bit temporary value used by the procedure
    BIT_COMPRESS_REMOTE_DATA for shifting the bits of the data.

BURST_0_PAUSE_1 A bit set to 0 to show that the data referred to is a burst
    of IR data referred to by pulse count, and set to 1 to indicate
    that it is a pause between IR bursts, referred to by the length of
    time of the pause.

BYTE_COUNT An index into the KEY_CATEGORY_VALUE array being compressed
    by the BIT_COMPRESSED_REMOTE_DATA procedure.

CATEGORY_BITS A one byte value ranging from 1 to 5. This tells the number
    of bits per category representation in the bit compressed format
    of the category data.

CATEGORY_COUNT An array of 25 entries of 2 bytes each. Each entry is either
    a reference pulse count for this category, or a reference length of
    time for a pause for this category.

CATEGORY_POINTER A pointer to a 1 byte value within the 200_BYTE_ARRAY.
    Range 0-199. This is used to address the categorized data by
    the CONVERT_IR_DATA_TO_CATEGORIES procedure.

CATEGORY_NUMBER An 8 bit value which refers to one of the CATEGORY_COUNT
    or CATEGORY_TYPE entries. Range is 1-25.

CATEGORY_TYPE An array of 25 bits. Each bit indicates whether the
    corresponding category is a burst count
    [CATEGORY_TYPE(CATEGORY_NUMBER) = 0] or a pause time [ = 1].

CATEGORY_VALUE An 8 bit value which refers to one of the CATEGORY_COUNT
    or CATEGORY_TYPE entries. Range is 1-25.

COMPRESSED_DATA An 8 bit temporary value used by the procedure
    BIT_COMPRESS_REMOTE_DATA. This byte is used to rotate the
    data to be compressed into, one bit at a time. When the byte is
    filled, then it is transferred into the KEY_COMPRESSED_DATA array
    for this key.

CW A bit set true if the IR data learned contains more than
    500 milliseconds of continuous IR pulses (CW=Continuous Wave).
    This bit is false if the bits FINITE or ARRAY_FULL are set.

DATA_POINTER A pointer to a 2 byte value within the 400_BYTE_ARRAY.
    Range 0-398. This is used to address the data as it is taken
    or categorized in TAKE_IR_DATA and CONVERT_IR_DATA_TO_CATEGORIES.

DATA_SIZE An 8 bit value telling how many IR pulses and pauses have
    occurred when IR data was taken. Range 0 to 200.

EXIT_LEARN_MODE A bit set false when taking IR data and set true if the
    user switches the LEARN/NORMAL switch back to NORMAL during a
    learn procedure.

FINITE A bit set true if the 400_BYTE_ARRAY did not get filled by
    the incoming IR data because a pause longer than 500 milliseconds
    occurred. This bit is false if the bits CW or ARRAY_FULL are set.

IR_ENVELOPE    A bit corresponding to one digital signal from the IR
   envelope detector hardware on the RRC. This bit is false when
   there is no IR coming in and true (continuously) when a stream of
   IR pulses is coming in with a frequency greater than 15KHz.
KEEP_CATEGORY_DATA    A bit set true at the start of each key being learned
   and toggled true and false with each unsuccessful attempt to learn
   that key. This bit determines whether the calculated CATEGORY_VALUE
   replaces or is just compared to the data in the 200 byte array.
KEY    An 8 bit value which represents one of the sets of key data
   from the keys trained. This value points to the data in the order
   in which they are stored in memory (KEY=1 refers to the first set of
   data, KEY=2 to the second, etc.). Note that the order in which the
   data is stored in memory and referred to by KEY may not correspond
   to the order of the keys on the RRC, or the keys on the remote being
   learned, or the order in which the keys were learned.
KEY_CATEGORY_VALUE    This is an array of byte values with 2 indices and
   no fixed length or position for the data. The data represents the
   stored category values calculated for several keys during a learning
   session. The first index is the key index, and frequently uses
   the variable KEY in the PDL above. This selects one of the stored
   sets of category values which correspond to this key index. The
   sets of category values are not necessarily next to each other in
   memory. The second index is the burst or pause index which points
   to a byte of data representing what category this burst or pause
   corresponds to.
KEY_DATA_SIZE    This is an array of byte values. There is one value
   assigned to each key learned, and stored with the key data. This
   value tells how many bytes of data are in the KEY_CATEGORY_VALUE
   array for this key.
KEY_LEARNED    A bit set true or false to determine whether a key has been
   learned or not during the procedure LEARN_ONE_KEY.
LEARN_MODE    A bit corresponding to the position of the LEARN/NORMAL
   switch that the user switches to choose between learn and normal mode.
MAX_CATEGORY_NUMBER    A constant which tells the maximum number of
   categories used. The value is 25.
MAX_PULSES    A 16 bit counter which is set to the maximum number of pulses
   in a pulse burst encountered during a TAKE_IR_DATA procedure.
   This value is used with MAX_TIME to calculate the IR carrier
   frequency.
MAX_TIME    A 16 bit value which is set to the time elapsed during the
   pulse burst with maximum pulses during a TAKE_IR_DATA procedure.
   This value is used with MAX_PULSES to calculate the IR carrier
   frequency.
MISMATCH_COUNT    An 8 bit value which counts the number of categories which
   did not match between successive presses of the same key during a
   LEARN_ONE_KEY procedure.
MISMATCH_TOLERANCE    A constant which tells how many category mismatches
   can be allowed and still call successive keypresses learned.
   This is normally set to 1 or 2.
NO_DATA_IN_5_MINUTES    A bit set to false during the procedure TAKE_IR_DATA
   and set to true if no IR data comes in during the next 5 minutes.
   This bit indicates that the user has forgotten to do the programming.
NUMBER_OF_CATEGORIES    An 8 bit value telling how many different categories
   are currently defined in the CATEGORY_COUNT array.
NUMBER_OF_KEYS_LEARNED    An 8 bit value that indicates the number of keys
   which have been learned for the remote which is currently being
   learned.
OLD_DATA_SIZE    An 8 bit value copied from DATA_SIZE telling how large the
   categorized data in the CATEGORY_TYPE array is. Range 0 to 100.
PREAMBLE    A 1 bit value set true if a common preamble to all learned
   keys exists, and set false if no common preamble exists.
PREAMBLE_CODE    This is an array of byte values which correspond to the
   category bytes common to all keys for this remote control. The
   total length of data varies depending on the length of the preamble
PREAMBLE_LENGTH    An 8 bit value indicating how long the preamble is which is
   common to all of the learned keys.
PULSE_TIME_COUNT    A 16 bit value which holds either the pulse count
   or pause time for use by the CONVERT_IR_DATA_TO_CATEGORIES procedur
REPEAT    A bit set true if there is a repeat data in the 200_BYTE_AR
   and set false if there is no repeat data.
REPEAT_LENGTH    An 8 bit value which tells how many bytes of category data
   in the 200_BYTE_ARRAY are repeated, starting at the REPEAT_START
   byte. If no data repeats, then REPEAT_LENGTH=0.

REPEAT_TIMES    An 8 bit value used by the procedure REMOVE_REPEATS to
    calculate how many times the repeat section is repeated during each
    keypress.  If REPEAT_TIMES = 255, then the repeat section repeats
    as long as the key is held down.
REPEAT_START    An 8 bit value that tells which byte of the data in the
    200_BYTE_ARRAY is the start of the repeat data.  If the data repeat
    unit starts on the third byte, then REPEAT_START=3.  If the data
    does not repeat, then REPEAT_START=0.
RETRIES         An 8 bit counter which determines how many attempts are made
    to learn a key before an error is declared.
RRC             Stands for Reconfigurable Remote Control.  Also called
    the GENIUS.
SINGLE_PULSE    A bit set if the data taken was pulsed IR without a carrier
    (pulse repeat rate under 15KHz), and cleared if the data was
    a burst of IR pulses at a carrier frequency.
VALID_DATA      A bit set true or false by procedure TAKE_IR_DATA to indicate
    whether the procedure is returning valid or invalid IR data.

DATA BASE EXAMPLE

DATA AS STORED IN VOLATILE RAM DURING A LEARN OPERATION
-------------------------------------------------------

```
DATPTR: DW      KEY_1           ;address of the data for the first key stored
        DW      KEY_2           ;two bytes per address
        DW      KEY_3           ;as many addresses as there are keys learned
        DW      KEY_4
        DW      KEY_5
        DW      KEY_6
  . . .
        DW      KEY_LAST        ;address of the data for the last key stored
                                ;start of the RAM area available for key data
KEY_1:  DB      KEY_NUMBER      ;which button on the RRC this data represents
        DB      KEY_FREQUENCY
        DB      KEY_FREQUENCY_RANGE
        DB      KEY_REPEAT_START
        DB      KEY_REPEAT_LENGTH
        DB      KEY_REPEAT_TIMES
        DB      KEY_CATEGORY_VALUE      ;total bytes required for this array
  . . .                         ;is sum of KEY_REPEAT_START and KEY_REPEAT_LENGTH
KEY_2:  DB      KEY_NUMBER      ;same data arrangement as KEY_1, above
  . . .
KEY_3:  . . .
```

DATA AS STORED IN NON-VOLATILE RAM AFTER LEARN OPERATION(S)
-----------------------------------------------------------

```
                        ;start of non-volatile (battery backed up) RAM
REMOTES:
        DW      REMOTE_1        ;pointer to the stored data for remote 1 (TV)
        DW      REMOTE_2        ;pointer to the stored data for remote 1 (VCR)
        DW      REMOTE_3        ;pointer to the stored data for remote 1 (CABLE)
        DW      REMOTE_4        ;pointer to the stored data for remote 1 (AUX)

;this is the remote data for the TV remote control
                ;it always starts at the ninth byte of the non-volatile RAM
REMOTE_1:
        DB      REMOTE_MAX_CATEGORY_NUMBER      ;# categories for this remote
        DB      REMOTE_CATEGORY_BITS            ;# bits per category
        DB      REMOTE_PREAMBLE_LENGTH  ;# bursts and pauses in preamble
        DW      REMOTE_KEY_NUMBER       ;# keys learned for this remote
        DW      REMOTE_KEY1     ;address for data of first key learned
        DW      REMOTE_KEY2     ;address for data of second key learned
        DW      REMOTE_KEY3
```

```
DW      REMOTE_KEY_LAST ;address for data of last key learned

DW      REMOTE_CATEGORY_COUNT
                ;this array stores the pulse counts and
                ;pause times for this remote. this
                ;uses 2*REMOTE_MAX_CATEGORY_NUMBER bytes DW      REMOTE_PREAMBLE_CODE
                ;this stores the preamble category
                ;string in uncompressed format. this
                ;uses REMOTE_PREAMBLE_LENGTH bytes REMOTE_KEY_1:
        DB      REMOTE_KEY_NUMBER
        DB      REMOTE_KEY_FREQUENCY
        DB      REMOTE_KEY_FREQUENCY_RANGE
        DB      REMOTE_KEY_REPEAT_START
        DB      REMOTE_KEY_REPEAT_LENGTH
        DB      REMOTE_KEY_REPEAT_TIMES
        DB      REMOTE_KEY_CATEGORY_VALUE
        . . .           ;this array holds the bit compressed values for th
                        ;category string which represents this key. The
                        ;number of bytes required is the smallest integer
                        ;greater than of equal to:
; REMOTE_CATEGORY_BITS*(REMOTE_KEY_REPEAT_START+REMOTE_KEY_REPEAT_LENGTH)/

REMOTE_KEY_2:
        DB      REMOTE_KEY_NUMBER
        . . .
        . . .
        . . .

REMOTE_KEY_LAST:
        DB      REMOTE_KEY_NUMBER
        DB      REMOTE_KEY_FREQUENCY
        DB      REMOTE_KEY_FREQUENCY_RANGE
        DB      REMOTE_KEY_REPEAT_START
        DB      REMOTE_KEY_REPEAT_LENGTH
        DB      REMOTE_KEY_REPEAT_TIMES
        DB      REMOTE_KEY_CATEGORY_VALUE
        . . .

;this is the remote data for the VCR remote control
                        ;where it starts depends on how much memory was used by th
                        ;TV remote data.
REMOTE_2: . . .
```

I claim:

1. For use with a plurality of remotely controlled products or appliances each of which is controllable with one or more signals transmitted from an associated remote control transmitter, a reconfigurable remote control transmitter for emulating the remote control transmitters of said plurality of remotely controlled products or appliances comprising:
receiver means for receiving signals transmitted from a remote control transmitter to be emulated during a learning mode, said signals being comprised of bursts of pulses separated by pauses;
prompting means;
microprocessor means connected to receive the output of said receiver means and coupled to said prompting means for prompting a user to initiate transmission of a signal from the remote control transmitter to be emulated and counting the numbr of pulses in each burst of pulses and timing the duration of each pause of a transmission, said microprocessor means being programmed to categorize the pulse bursts and pauses and generate a compressed code for each signal provided by the remote control transmitter to be emulated;
memory means addressed by said microprocessor means for storing said compressed codes; and
transmitter means controlled by said microprocessor means in an emulation mode for transmitting a coded signal or controlling a selected remotely controlled product or appliance, said microprocessor means being further programmed to recall from said memory means a desired compressed code, expand said code and cause said transmitter means to transmit the coded signal.

2. The reconfigurable remote control transmitter as recited in claim 1 wherein said memory means includes a nonvolatile memory.

3. The reconfigurable remote control transmitter as recited in claim 1 wherein said memory means comprises:
first random access memory means for storing intermediate data and second random access memory means being for storing said compressed codes, said second random access memory means being nonvolatile; and address register means connected to said microprocessor means and each of said first and second random access memory means for storing addresses generated by said microprocessor means, said first random access memory means being addressed by said microprocessor means during said learning mode and for the generation of said compressed codes, said second random access memory means being addressed by said microprocessor means for storing said compressed codes and during said emulation mode.

4. The reconfigurable remote control transmitter as recited in claim 3 wherein both said first and second random access memory means are CMOS memories and said second random access memory means further includes a low voltage battery to maintain the data stored in the CMOS memory.

5. The reconfigurable remote control transmitter as recited in claim 1 further comprising:
  selection means connected to said microprocessor means for permitting a user to select one of said remote control transmitters to be emulated; and
  learn switch means connected to said microprocessor means for selecting said learn mode or said emulation mode.

6. The reconfigurable remote control transmitter as recited in claim 5 further comprising keyboard means for emulating a keyboard of any one of the remote control transmitters to be emulated depending on the selection the user has made using said selection means, said microprocessor means when in said learning mode prompting the user to first press a key on said keyboard means and then a corresponding key of the remote control transmitter to be emulated.

7. The process of learning, storing and reproducing the remote control codes of any of a diverse plurality of remote control transmitters comprising the steps of:

receiving a transmission from a remote control transmitter;
counting the number of pulses in each burst of pulses and timing the duration of each pause in said transmission;
categorizing said pulse bursts and said pauses;
generating a compressed code from the categorized pulse bursts and pauses;
storing said compressed code;
on command, accessing said stored compressed code and expanding the accessed code to regenerate the original pulse bursts and pauses; and
transmitting said regenerated pulse bursts and pauses.

8. The process as recited in claim 7 wherein said steps of receiving, counting and timing, and categorizing are repeated at least twice further comprising the step of correlating the results of two categorizing steps before completing said process.

9. The process as recited in claim 7 further comprising the steps of:
determining the frequency of said received transmission;
storing a frequency code corresponding to said determined frequency; and
synthesizing a carrier frequency corresponding to said frequency code for performing said step of transmitting.

10. The process as recited in claim 7 wherein the step of generating a compressed code comprises the steps of:
removing repeating sequences of said categorized pulse bursts and pauses;
encoding the number and position of the repeating sequences;
stripping any preamble common to a plurality of received transmissions; and
separately encoding said common preamble.

* * * * *